(12) United States Patent
Djomehri et al.

(10) Patent No.: US 6,955,969 B2
(45) Date of Patent: Oct. 18, 2005

(54) METHOD OF GROWING AS A CHANNEL REGION TO REDUCE SOURCE/DRAIN JUNCTION CAPACITANCE

(75) Inventors: Ihsan J. Djomehri, Mountain View, CA (US); Jung-Suk Goo, Stanford, CA (US); Srinath Krishnan, Campbell, CA (US); Witold P. Maszara, Morgan Hill, CA (US); James N. Pan, Fishkill, NY (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/654,497

(22) Filed: Sep. 3, 2003

(65) Prior Publication Data

US 2005/0048743 A1 Mar. 3, 2005

(51) Int. Cl.$^7$ ............... H01L 21/336; H01L 21/338
(52) U.S. Cl. ............... 438/269; 438/156; 438/173; 438/175

(58) Field of Search ............... 438/156, 173, 438/175, 206, 217, 226, 268, 269, 479

(56) References Cited

U.S. PATENT DOCUMENTS

| 6,096,590 A | * | 8/2000 | Chan et al. ............... 438/233 |
| 6,339,232 B1 | * | 1/2002 | Takagi ............... 257/192 |
| 6,503,833 B1 | * | 1/2003 | Ajmera et al. ............... 438/682 |
| 6,537,862 B2 | * | 3/2003 | Song ............... 438/157 |

* cited by examiner

Primary Examiner—Amir Zarabian
Assistant Examiner—Pamela E Perkins
(74) Attorney, Agent, or Firm—Foley & Lardner LLP

(57) ABSTRACT

A method of forming a channel region for a transistor includes forming a layer of silicon germanium (SiGe) above a substrate, forming an oxide layer above the SiGe layer wherein the oxide layer includes an aperture in a channel area and the aperture is filled with a SiGe feature, depositing a layer having a first thickness above the oxide layer and the SiGe feature, and forming source and drain regions in the layer.

16 Claims, 5 Drawing Sheets

METHOD OF GROWING AS A CHANNEL REGION TO REDUCE SOURCE/DRAIN JUNCTION CAPACITANCE

FIELD OF THE INVENTION

The present invention is related to integrated circuit (IC) devices. More particularly, the present invention relates to a method of growing strained silicon as a channel region to reduce source/drain junction capacitance.

BACKGROUND OF THE INVENTION

Metal-Oxide-Semiconductor Field Effect Transistor (MOSFET) technology is well known and widely used in the electronics industry. Performance enhancement between generations of devices is generally achieved by reducing the size of the device, resulting in an enhancement in device speed. This is generally referred to as device "scaling." As MOSFETs are scaled to channel lengths below 100 nm, conventional MOSFETs suffer from several problems. In particular, interactions between the source and drain of the MOSFET degrade the ability of the gate of the same to control whether the device is on or off. This phenomenon is called the "short-channel effect".

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region. SOI is advantageous since it reduces unwanted coupling between the source and the drain of the MOSFET through the region below the channel. This result is often achieved by ensuring that all the silicon in the MOSFET channel region can be either inverted or depleted by the gate (called a fully depleted SOI MOSFET). As device size is scaled, however, this becomes increasingly difficult because the distance between the source and drain is reduced. The reduced distance increases interaction with the channel, reducing gate control and increasing short channel effects.

The double-gate MOSFET structure places a second gate in the device, such that there is a gate on either side of the channel. This allows gate control of the channel from both sides, reducing short channel effects. Additionally, when the device is turned on using both gates, two conduction ("inversion") layers are formed, allowing for more current flow or higher drive current. An extension of the double-gate concept is the "surround-gate" or "wraparound-gate" concept, where the gate is placed such that it completely or almost-completely surrounds the channel, providing better gate control.

These double-gate MOSFETs are sometimes referred to as "FinFET" structures because of their shape. One method of forming FinFET structures is by first forming channels and then source and drain regions are formed by a silicon deposition process. This results in source and drain which are necessarily taller than the channel fin, and the gate length is defined by using an oxide spatial process to create a gap between the tall source and drain islands. This gap is then filled with gate material so that the gate straddles the fin and forms a double gate device.

In a bulk type device, such as a MOSFET, the use of Si—Ge materials can increase charge carrier mobility, especially hole type carriers. A channel region containing germanium can have charge carrier mobility 2–5 times greater than a conventional Si channel region due to reduce charge carrier scattering and due to the reduced mass of holes in the germanium-containing material. According to conventional Si—Ge formation techniques for bulk-type devices, a dopant implanted molecular beam epitaxy (MBE) technique forms a Si—Ge epitaxial layer. However, the MBE technique requires very complicated, very expensive equipment and is not feasible for mass production of integrated circuits.

In silicon MOSFET devices, it has been shown that performance can be enhanced by enhancing the mobility of electrons and holes in, for example, the channel region. One way to enhance mobility is by the use of strained materials, such as strained silicon. A material under compressive stress enhances hole carrier mobility because the holes are confined to a strained area by the potential energy offset between the surrounding silicon regions and the strained area.

A silicon germanium layer can be provided in the channel region to achieve a channel region containing germanium. As transistor dimensions are minimized, the thickness of the silicon germanium layer must be very thin (e.g., less than several hundred angstroms). Conventional fabrication methods have not been able to feasibly produce strained silicon channel regions above silicon germanium layers.

Thus, there is a need for a method of growing strained silicon as a channel region to reduce source/drain junction capacitance. Further, there is a need for enhanced channel mobility. Further still, there is a need for a method of fabricating a strained silicon channel layer over a silicon germanium layer.

SUMMARY OF THE INVENTION

An exemplary embodiment relates to a method of forming a channel region for a transistor. The method includes forming a layer of silicon germanium (SiGe) above a substrate, forming an oxide layer above the SiGe layer wherein the oxide layer includes an aperture in a channel area and the aperture is filled with a SiGe feature, providing a strained silicon layer having a first thickness above the oxide layer and the SiGe feature, and forming source and drain regions in the strained silicon layer.

Another exemplary embodiment of the invention relates to an integrated circuit having a strained silicon channel below a gate structure. The integrated circuit is formed by a process including etching a section in an oxide layer above a compound material layer to expose a portion of the compound material layer, filling the section etched from the oxide layer with a filler material, forming a strained silicon layer above the filler material, and forming a gate above the strained silicon layer.

Another exemplary embodiment of the invention relates to an integrated circuit transistor including a strained silicon channel. The integrated circuit transistor includes a strained silicon layer above a compound material layer, a gate structure above the strained silicon layer, active regions in the strained silicon layer, and spacers along lateral sidewalls of the gate structure.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals will denote like elements, and.

DETAILED DESCRIPTION OF EXEMPLARY EMBODIMENTS

Figure 1:
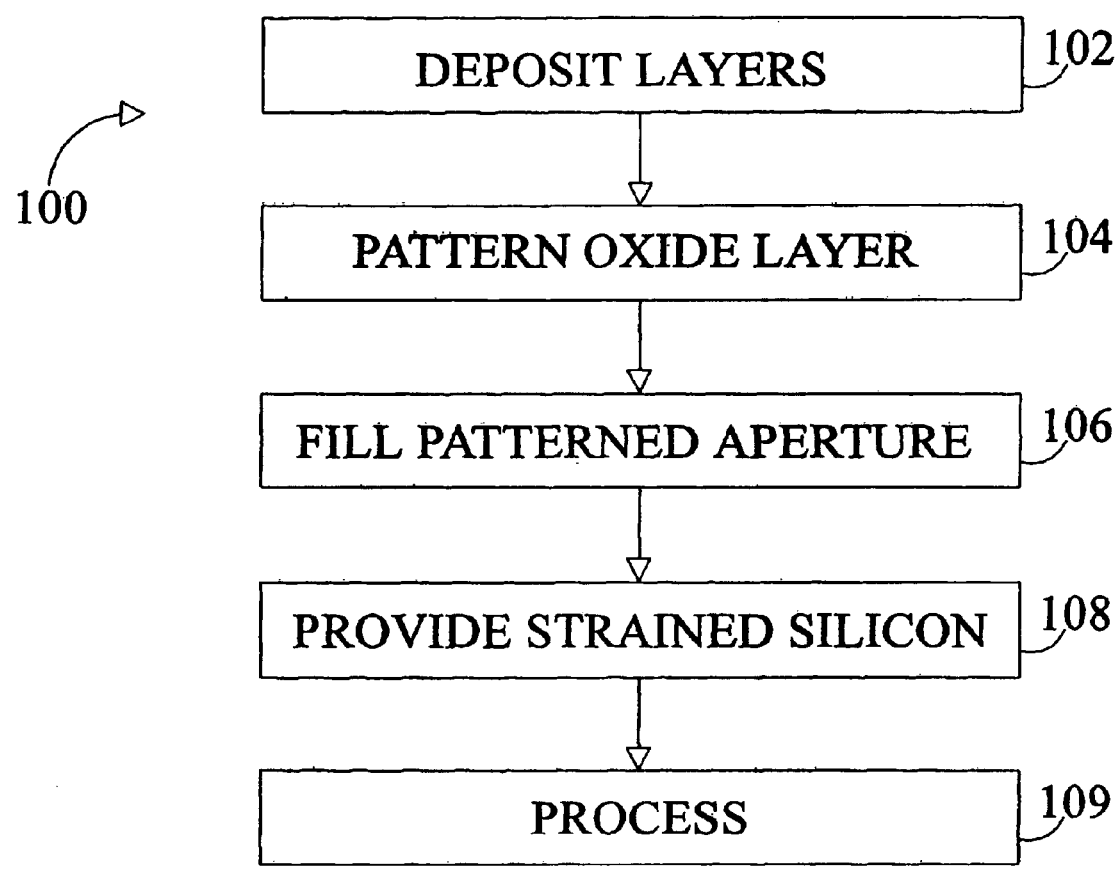
FIG. 1 is a general process flow diagram of a process of growing strained silicon as a channel region in accordance with an exemplary embodiment.

With reference to FIG. 1, an advantageous process 100 forms strained silicon as a channel region to reduce source/drain junction capacitance. While process 100 is described by way of example, additional, fewer, or different operations may be performed.

In an operation 102, various layers are deposited. For example, a silicon germanium (SiGe) layer is deposited above a substrate. The substrate can be a silicon structure, for example. An oxide layer is deposited above the silicon germanium layer. The oxide layer can be silicon dioxide ($SiO_2$). Alternatively, the compound semiconductor layer below the oxide layer can be provided as a substrate purchased from a wafer manufacturer.

In an operation 104, the oxide layer is patterned using a resist mask patterned previously. The patterning of the oxide layer exposes a portion of the SiGe layer.

In an operation 106, a material is deposited to fill the aperture formed in the oxide layer. In an exemplary embodiment, a polishing operation is used to make the oxide layer and the filled aperture coplanar. The material can be a compound semiconductor material, such as, SiGe or any material for forming strained semiconductor layers.

In an operation 108, a strained silicon layer is provided above the oxide layer and fills the aperture. The strained silicon layer can be grown epitaxially. The strained silicon layer can be 200 Angstroms or less in cross-sectional thickness. In an operation 109, structures are formed in a process to make an integrated circuit device. The strained silicon layer provides a channel region for the integrated circuit device.

Figure 2:
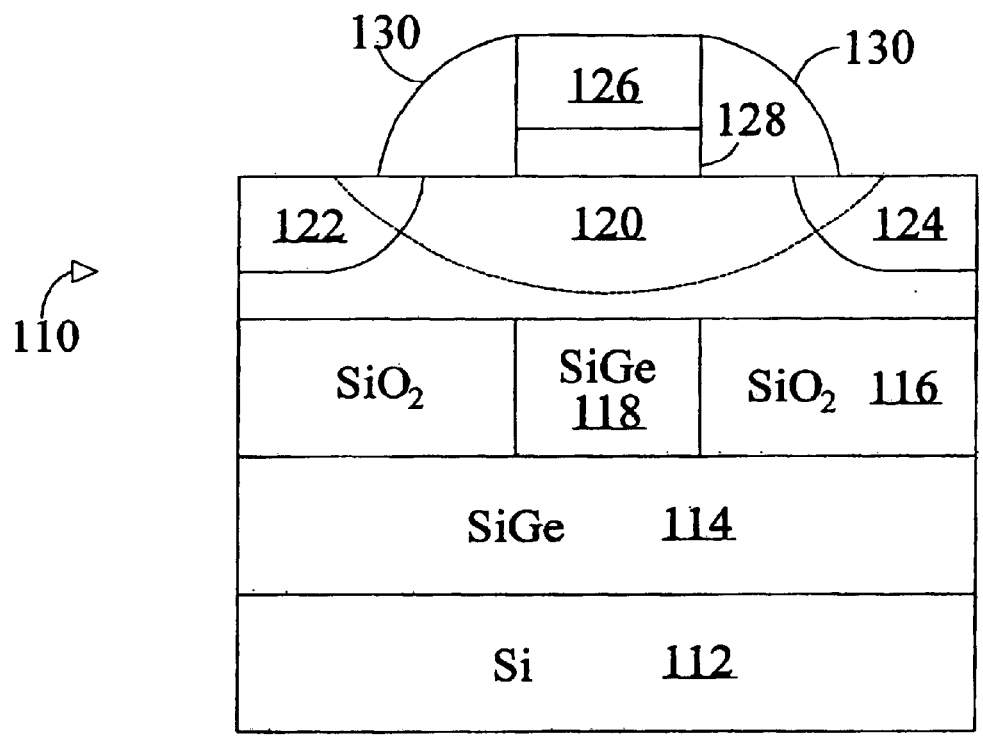
FIG. 2 is a schematic cross-sectional view of a portion of an integrated circuit including a strained silicon channel region in accordance with an exemplary embodiment of the present invention.

With reference to FIGS. 1–8, process 100 (FIG. 1) will be described below. In FIG. 2, a portion 110 of an integrated circuit includes a substrate 112, a silicon germanium (SiGe) layer 114, an oxide layer 116, SiGe portion 118, strained silicon region 120, source region 122, drain region 124, gate structure 126, gate dielectric 128, and spacers 130. Portion 110 is preferably part of an ultra-large-scale integrated (ULSI) circuit having a million or more transistors. In an exemplary embodiment, portion 110 is manufactured as part of the integrated circuit on a semiconductor wafer (e.g., a silicon wafer). Substrate 112 can be any type of integrated circuit substrate suitable for building a circuit including strained silicon fins.

Oxide layer 116 can be a variety of different oxide materials including silicon dioxide. Oxide layer 116 can have a cross-sectional thickness of 1,000 Angstroms or less. Strained silicon region 120 is formed using strained silicon, having a thickness of 200 Angstroms. In another embodiment, strained silicon region 120 has a thickness of less than 200 Angstroms.

Figure 3:
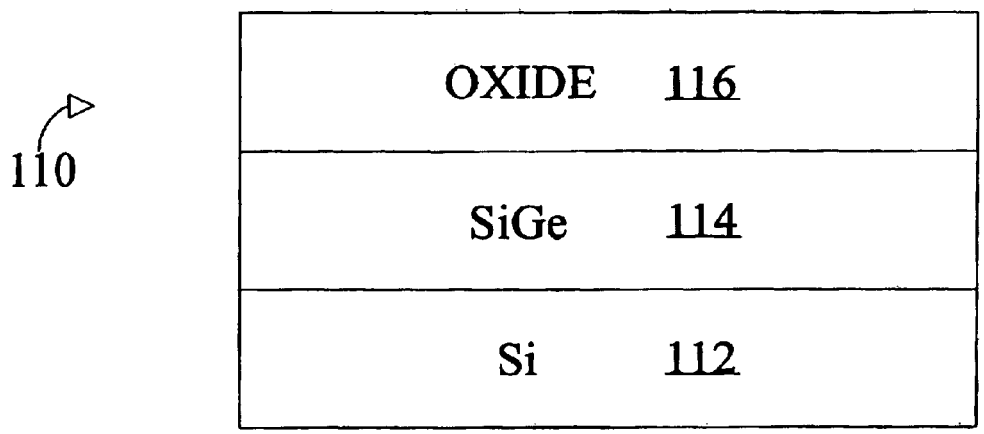
FIG. 3 is a schematic cross-sectional view of the portion of the integrated circuit illustrated in FIG. 2, showing a layer provision operation.

With reference to FIG. 3, substrate 112, silicon germanium layer 114, and oxide layer 116 are provided in the operation 102 (FIG. 1). Silicon germanium layer 114 can be deposited using an epitaxial growth technique. Oxide layer 116 can be deposited using a standard growth process.

Figure 4:
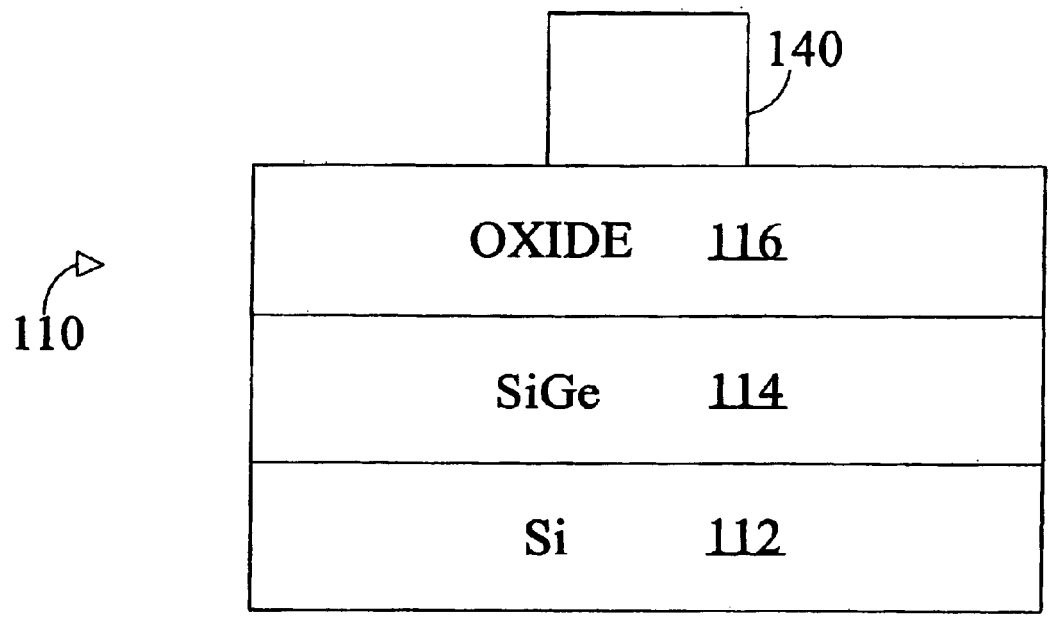
FIG. 4 is a schematic cross-sectional view of the portion of the integrated circuit illustrated in FIG. 2, showing a resist patterning operation.
Figure 5:
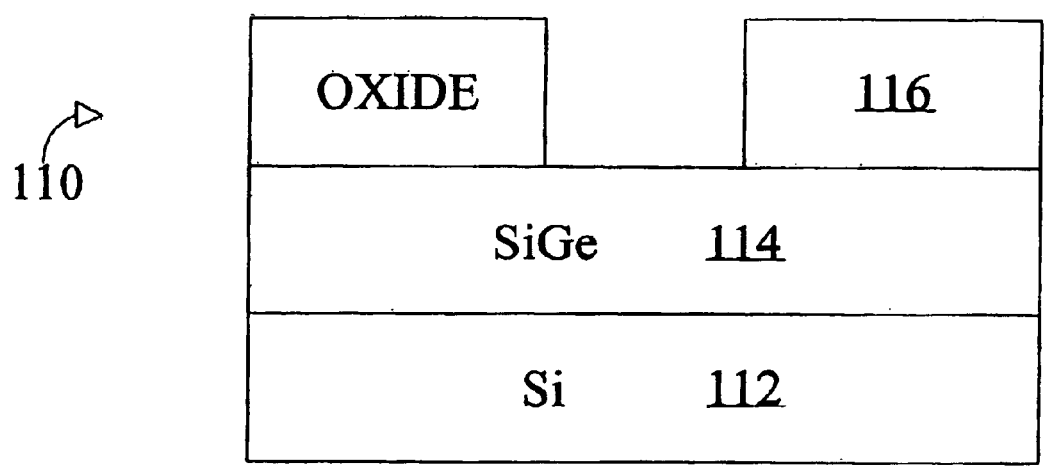
FIG. 5 is a schematic cross-sectional view of the portion of the integrated circuit illustrated in FIG. 2, showing an etching operation to form an aperture.

In FIG. 4, a resist structure 140 is formed above silicon germanium 114 and oxide layer 116 as part of the patterning operation 104 (FIG. 1). Resist structure 140 is formed of photoresist and is used as a mask to pattern an aperture in oxide layer 116, exposing a portion of silicon germanium layer 114. In FIG. 5, oxide layer 116 is shown with the aperture formed and a portion of silicon germanium layer 114 is exposed.

Figure 6:
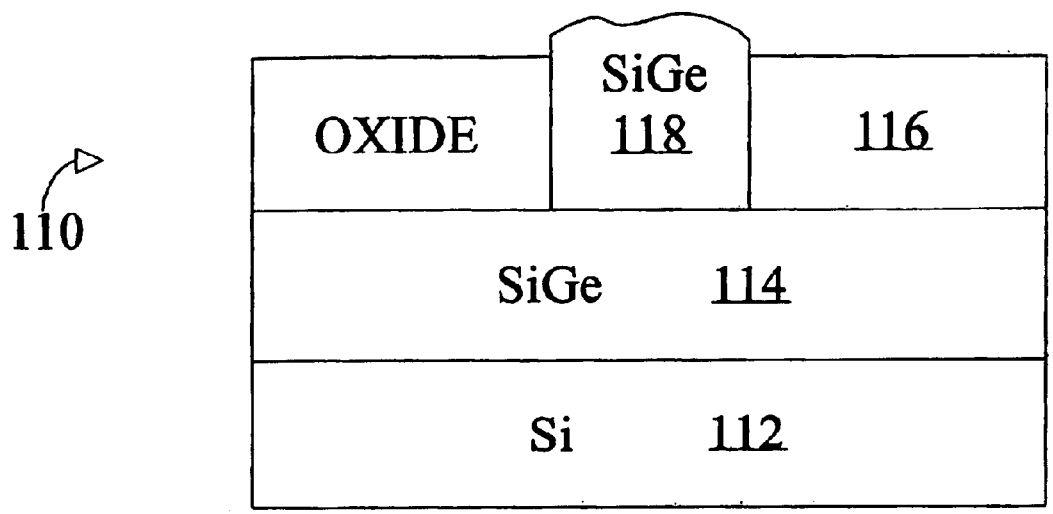
FIG. 6 is a schematic cross-sectional view of the portion of the integrated circuit illustrated in FIG. 2, showing an aperture filling operation.
Figure 7:
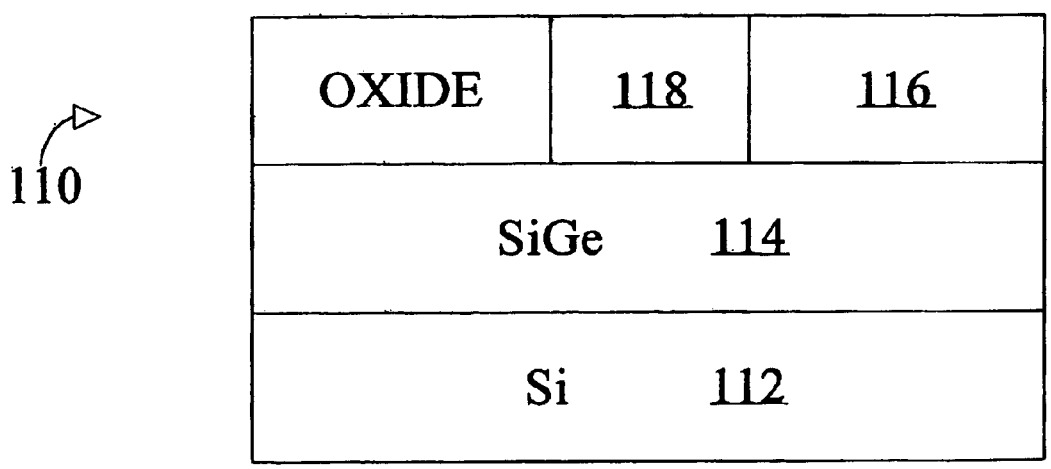
FIG. 7 is a schematic cross-sectional view of the portion of the integrated circuit illustrated in FIG. 2, showing a planar polish operation.

In FIG. 6, silicon germanium is deposited to fill the aperture in the operation 106 (FIG. 1) and form silicon germanium (SiGe) portion 118. In FIG. 7, SiGe portion 118 is shown having a top that is coplanar with the top of oxide layer 116. In at least one embodiment, a polishing operation is performed to make SiGe portion 118 and oxide layer 116 coplanar. SiGe portion 118 is preferably selected to have a width similar to the width of a gate structure. For example, SiGe portion 118 can have a width of 1 micron or less.

Figure 8:
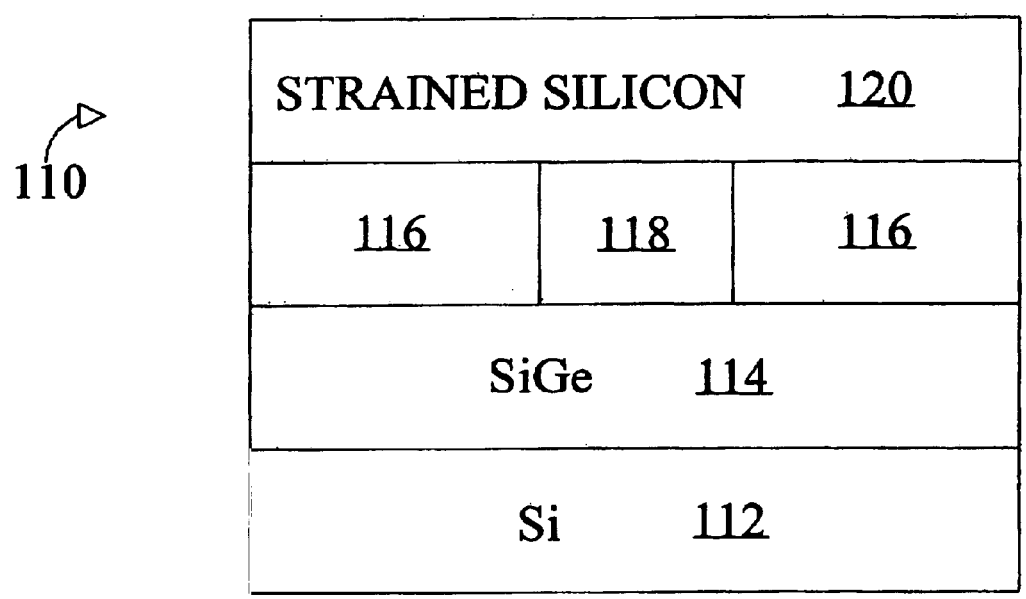
FIG. 8 is a schematic cross-sectional view of the portion of the integrated circuit illustrated in FIG. 2, showing a strained silicon provision operation.

In FIG. 8, strained silicon is provided over SiGe portion 118 and oxide layer 116 in the operation 108 (FIG. 1). Preferably, strained silicon is grown epitaxially to form strained silicon region 120. The entire grown crystal layer will be strained because the silicon is deposited epitaxially over a material with a different lattice constant. Strained silicon region 120 can have a thickness of 200 Angstroms or less. In one embodiment, strained silicon region 120 has a thickness of 100 Angstroms.

Strained silicon region 120 can be doped in certain sections to form source region 122 and drain region 124. A variety of different processes may be employed to create source region 122 and drain region 124 within strained silicon region 130. Further processing includes the formation of gate structure 126, gate dielectric 128, and spacers 130 over strained silicon region 120.

Advantageously, strained silicon region 120 provides a channel region between source region 122 and drain region 124 providing enhanced mobility for electrons by reducing the scattering of electrons. Indeed, electrons pass from source region 122 to drain region 124 more efficiently.

While the above exemplary embodiments have been described with regard to the formation of a strained silicon channel using an epitaxial strained silicon layer, other formation processes can be utilized. Further, system parameters and design criteria can effect the selection of materials and thicknesses without departing from the scope of the invention. The invention is not limited to a particular embodiment, but extends to various modifications, combinations, and permutations that never less fall within the scope and spirit of the appended claims.

What is claimed is:

1. A method of forming a channel region for a transistor, the method comprising:

forming a layer of silicon germanium (SiGe) above a substrate;

forming an oxide layer above the SiGe layer wherein the oxide layer includes an aperture exposing a portion of the SiGe layer in a channel area and the aperture is filled with a SiGe feature;

providing a layer having a first thickness above the oxide layer and the SiGe feature; and forming source and drain regions in the layer.

2. The method of claim 1, further comprising forming a gate structure and spacer sidewalls above the layer.

3. The method of claim 1, wherein the layer has a thickness of 200 Angstroms or less.

4. The method of claim 3, wherein the layer has a thickness of 100 Angstroms.

5. The method of claim 1, wherein forming an oxide layer above the SiGe layer wherein the oxide layer includes an aperture in a channel area and the aperture is filled with a SiGe feature comprises selectively etching the aperture in the channel area, depositing a SiGe material, and polishing the deposited SiGe material to make it coplanar with the oxide layer.

6. The method of claim 1, wherein the layer has a cross-sectional thickness of 200 Angstroms or less.

7. An integrated circuit having a channel below a gate structure, the integrated circuit being formed by a process, the process comprising:

etching a section in an oxide layer above a compound material layer to expose a portion of the compound material layer;

filling the section etched from the oxide layer with a filler material; and forming a layer above the filler material;

and forming a gate above the layer.

8. The integrated circuit formed by the process of claim 7, wherein the compound material layer comprises silicon germanium (SiGe).

9. The integrated circuit formed by the process of claim 7, wherein the filler material comprises silicon germanium (SiGe).

10. The integrated circuit formed by the process of claim 7, wherein forming a layer comprises depositing a material.

11. The integrated circuit formed by the process of claim 7, wherein forming a layer comprises growing a material above the filler material.

12. The integrated circuit formed by the process of claim 7, further comprising polishing the filler material to be coplanar with the oxide layer.

13. The integrated circuit formed by the process of claim 7, wherein the layer has a cross-sectional thickness of 200 Angstroms.

14. The integrated circuit transistor of claim 13, wherein the silicon germanium layer is disposed above a substrate.

15. The integrated circuit formed by the process of claim 7, wherein the filler material has a cross-sectional thickness of 1000 Angstroms or less.

16. The integrated circuit formed by the process of claim 7, wherein the filler material has a cross-sectional width of one micron or less.

* * * * *